(12) United States Patent
Jung et al.

(10) Patent No.: US 6,208,203 B1
(45) Date of Patent: Mar. 27, 2001

(54) LOW-NOISE AMPLIFIER

(75) Inventors: Chan Kook Jung, Inchon; Sang Hyun Park, Seoul; Jin Hyoung Choi, Inchon; Jong Hwa Park, Inchon; Sin Jae Kim, Inchon, all of (KR)

(73) Assignee: Ace Technology, Seoul (KR)

( * ) Notice: Subject to any disclaimer, the term of this patent is extended or adjusted under 35 U.S.C. 154(b) by 0 days.

(21) Appl. No.: 09/329,291

(22) Filed: Jun. 10, 1999

(30) Foreign Application Priority Data

| Jun. 11, 1998 | (KR) | 98-21613 |
| Jul. 7, 1998 | (KR) | 98-27169 |
| Mar. 15, 1999 | (KR) | 99-8688 |

(51) Int. Cl.$^7$ .................................................. H03F 3/68
(52) U.S. Cl. ........................................ 330/51; 330/124 D
(58) Field of Search ................................ 330/51, 124 D, 330/124 R, 151, 302

(56) References Cited

U.S. PATENT DOCUMENTS

| 4,298,844 | * 11/1981 | Shimp | 330/124 D |
| 4,780,685 | 10/1988 | Ferguson | 330/124 D |
| 5,418,490 | 5/1995 | Kaegebein | 330/124 D |
| 5,659,267 | 8/1997 | Buer et al. | 330/277 |
| 5,909,643 | * 6/1999 | Aihara | 330/51 X |
| 5,973,557 | * 10/1999 | Miyaji et al. | 330/51 |

FOREIGN PATENT DOCUMENTS

WO 91/19349  12/1991  (WO).

* cited by examiner

*Primary Examiner*—Steven J. Mottola
(74) *Attorney, Agent, or Firm*—Shanks & Herbert (57) ABSTRACT

A low-noise amplifier which is equipped with at least one redundancy circuit which is connected in parallel to an amplifying circuit, so that the low-noise amplifier operates without a significant signal loss even when an abnormality takes place in the amplifying circuit and the amplifying circuit is not replaced or troubleshooted. The low-noise amplifier includes a redundancy circuit (30) effectively operable instead of an amplifying circuit (24) when the amplifying circuit (24) is in an abnormal condition, and at least one switch (22) activates the redundancy circuit (30) when the amplifying circuit (24) is abnormal. In a preferred embodiment, the redundancy circuit (30) includes a transmission line (32) for bypassing an input RF signal when the amplifying circuit (24) is in an abnormal condition. In an alternative, the redundancy circuit (30) includes a redundant amplifying circuit (34), so that the redundant amplifying circuit (34) can amplify the input RF signal in place of the amplifying circuit (24).

8 Claims, 7 Drawing Sheets

LOW-NOISE AMPLIFIER

Hereby incorporated by reference are Korean priority applications 1998-21613, 1998-27169 and 1999-8688.

BACKGROUND OF THE INVENTION

1. Field of the Invention

The present invention relates to an amplifier circuit, and more particularly, to a low-noise amplifier circuit typically used for a wireless communications equipment.

2. Description of the Related Art

In a radio frequency (RF) signal receiving apparatus such as a cellular phone and a base station of a wireless communication system, a received signal has very weak intensity and includes considerable noise mixed therein. Accordingly, such a signal receiving apparatus requires a circuit for amplifying the received signal while reducing a noise figure of the signal. A low-noise amplifier, which is typically installed in an input stage of the signal receiving apparatus, amplifies the input RF signal so that an amplified signal has a required gain and noise figure.

Figure 1:
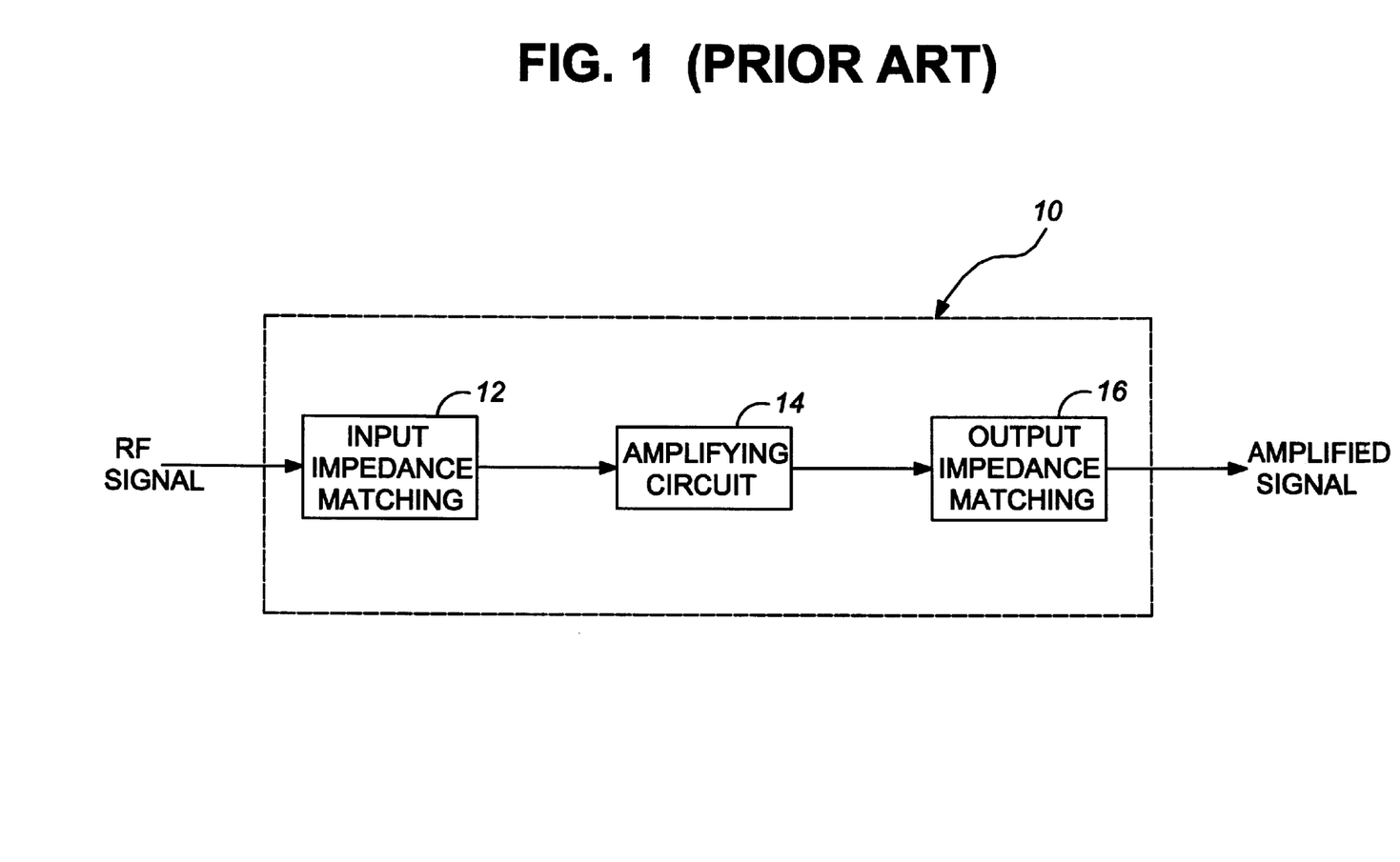
FIG. 1 is a block diagram of a conventional low-noise amplifier.

As illustrated in FIG. 1, a conventional low-noise amplifier 10 includes an amplifying circuit 14 performing an amplification of the RF signal and impedance matching circuits 12 and 16 for matching impedances between the amplifying circuit 14 and external circuits. The input and output impedance matching circuits 12 and 16 are designed based on scattering parameters (S-parameters) so that reflection coefficients are minimized at input and output stages of the amplifier. Meanwhile, since the low-noise amplifier determines the overall noise characteristics of the signal receiving apparatus, the amplifier is usually designed in a balanced type rather than a single-ended type so as to have a minimum noise figure.

Figure 2:
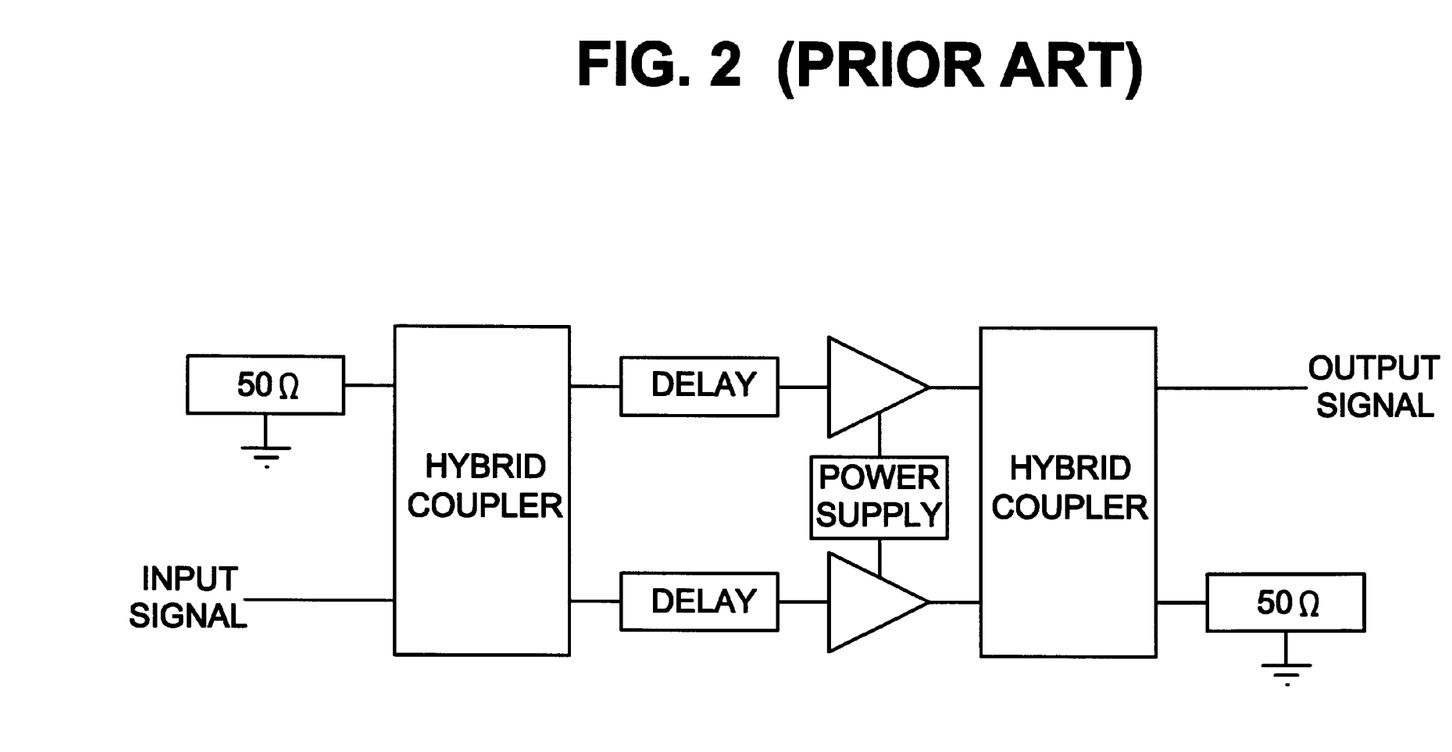
FIG. 2 is a detailed block diagram of the amplifying circuit in the low-noise amplifier of FIG. 1.

As shown in FIG. 2, a balanced type low-noise amplifier includes at least one amplifying stage, a power supply for providing DC power to the amplifying stage, hybrid couplers for splitting or combining signals at input and output stages, delay compensating circuits for compensating phase difference between the signal paths existing between the hybrid couplers, a noise removing circuit for reducing noise, and a comparator for comparing a signal or a supply voltage with a reference. In particular, the power supply can be implemented in various manners to procure an optimum amplification.

If any one of the internal circuits of the amplifying circuit happens to be damaged or the supply voltage is lost, the amplifying circuit cannot operate properly. In such a case, the signal receiving apparatus or the overall communication system happens to be faced with a significant signal loss. Meanwhile, when the low-noise amplifier cannot operate normally, the comparator in the amplifying circuit may detect the abnormality to notify a user via a light emitting diode so that the user replaces or troubleshoots the amplifying circuit. However, in a critical situation, the system may be inoperable at all until the user or a maintenance personnel replaces or troubleshoots the amplifying circuit.

SUMMARY OF THE INVENTION

The object of the present invention is to provide a low-noise amplifier which is equipped with at least one redundancy circuit which is connected in parallel to an amplifying circuit, so that the low-noise amplifier operates without a significant signal loss even when an abnormality takes place in the amplifying circuit and the amplifying circuit is not replaced or troubleshooted yet.

In order to achieve the above object, a low-noise amplifier according to the present invention includes a redundancy circuit effectively operable instead of an amplifying circuit when the amplifying circuit is in an abnormal condition, and at least one switch for activating the redundancy circuit when the amplifying circuit is abnormal. In a preferred embodiment, the redundancy circuit includes a transmission line for bypassing an input RF signal when the amplifying circuit is in an abnormal condition. In an alternative, the redundancy circuit includes a redundant amplifying circuit, so that the redundant amplifying circuit amplifies the input RF signal in place of the amplifying circuit.

According to the present invention, the low-noise amplifier is operable without a significant signal loss when the main amplifying circuit has an abnormality and cannot operate effectively. Thus, it is possible to prevent the communication system employing the circuit from being inoperable even when any one of the internal circuits of the amplifying circuit happens to be damaged or the supply voltage is lost. Accordingly, the reliabilities of the low-noise amplifier and the communication system are enhanced.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 3:
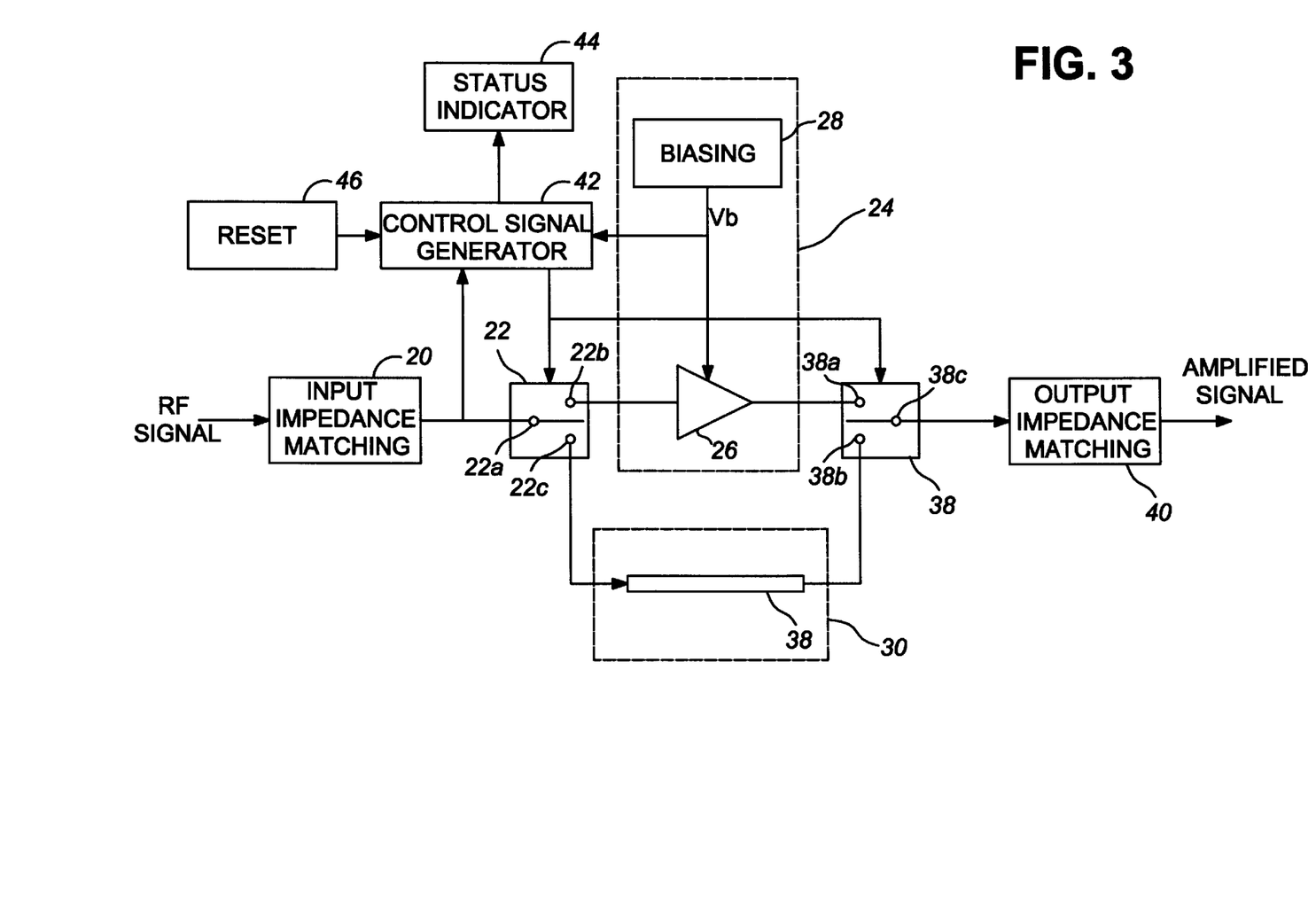
FIG. 3 is a block diagram of an embodiment of the low-noise amplifier according to the present invention.

A low-noise amplifier of FIG. 3, which amplifies a RF signal from a not shown RF signal source to provide an amplified signal to a not shown signal processing circuit, includes an input impedance matching circuit 20, a first switch 22, a first amplifying circuit 24, a redundancy circuit 30, a second switch 38, an output impedance matching circuit 40, and a control signal generator 42.

The input impedance matching circuit 20 matches an amplifier impedance at the input stage of the amplifier to the impedance of a transmission line connecting the RF signal source and the amplifier, so that the reflection of the RF signal at the input stage is minimized. The output impedance matching circuit 40 matches an amplifier impedance at the output stage of the amplifier to the impedance of a transmission line connecting the amplifier and the signal processing circuit, so that the reflection of the amplified signal at the output stage is minimized.

The input node 22a of the first switch 22 is connected to the output terminal of the input impedance matching circuit 20. Two output nodes 22b and 22c of the first switch 22 are connected to the input terminals of the first amplifying circuit 24 and the redundancy circuit 30, respectively. The input node 22a of the first switch 22 is electrically connected to either the first output node 22b or the second output node 22c in response to a switching control signal. Accordingly, the first switch 22 provides a signal from the matching circuit 20 to either the first amplifying circuit 24 or the redundancy circuit 30 according to the switching control signal.

In the preferred embodiment, the switching control signal may have two logic levels, i.e., a HIGH level and a LOW level. When the first amplifying circuit 24 operates normally, the switching control signal is at the HIGH level and the signal from the matching circuit 20 is provided to the first amplifying circuit 24. When the first amplifying circuit 24 is in an abnormal condition, however, the switching control signal is at the LOW level and the signal from the matching circuit 20 is provided to the redundancy circuit 30. The configuration of the first switch 22 will be described in detail below.

The first amplifying circuit 24 includes at least one amplifying stage 26 biased by a biasing circuit 28. The amplifying stage 26 amplifies the signal provided by the first switch 22. The first amplifying circuit 24 may be implemented by employing the conventional circuit of FIG. 2, for example. Meanwhile, the redundancy circuit 30 is implemented by use of a micro strip transmission line 32 having an impedance of 50 Ω. The width, length, and material of the micro strip 32 are designed based on a wavelength of the required frequency. The micro strip 32 functions as a low-loss signal path while the first amplifying circuit cannot operate normally.

Two input nodes 38a and 38b of the second switch 38 are connected to the output terminals of the first amplifying circuit 24 and the redundancy circuit 30, respectively. The output node 38c of the second switch 38 is connected to the input terminal of the output impedance matching circuit 40. The output node 38c of the second switch 38 is electrically connected to the first input node 38a or the second input node 38b in response to the switching control signal. Accordingly, the second switch 38 selects either the output of the first amplifying circuit 24 or that of the redundancy circuit 30 according to the switching control signal, and outputs the selected signal to the output impedance matching circuit 40. The second switch 38 may be configured in a manner similar to the first switch 22.

The control signal generator 42 monitors the operation status of the first amplifying circuit 24 and generates the switching control signal, of which level changes based on the monitored result. In the preferred embodiment, the control signal generator 42 monitors the normality of the biasing voltage Vb provided by the biasing circuit 28 to the amplifying stage 26 to change the level of the switching control signal. If the biasing voltage Vb is within a preset range, the control signal generator 42 outputs the switching control signal of HIGH level. If the biasing is voltage Vb deviates from the preset range, however, the control signal generator 42 outputs the switching control signal of LOW level.

Alternatively, the control signal generator 42 may detect the current or voltage level of the output signal of the matching circuit 20 in addition to the biasing voltage Vb to reflect the current or voltage level in determining the level of the switching control signal. In such a case, the switching control signal will be at HIGH level when both the biasing voltage Vb and the current or voltage level are within respective preset ranges, but at LOW level when the biasing voltage Vb or the current or voltage level deviates from the respective preset range.

In FIG. 3, a status indicator 44 indicates the operation status of the low-noise amplifier. For example, the status indicator 44 may include light emitting diodes showing which path of the first amplifying circuit 24 and the redundancy circuit 30 is effectively operative. Thus, a maintenance personnel may easily grasp the abnormality of the first amplifying circuit 24 to try the replacement or troubleshooting of the first amplifying circuit 24. Meanwhile, the maintenance personnel may change the operative path arbitrarily by use of the reset circuit 46. For example, the personnel may press a reset button to activate the reset circuit 46 upon the completion of the replacement or troubleshooting, so that the first amplifying circuit 24 restarts the effective operation.

On the other hand, in the low-noise amplifier according to the present invention, the output signal of either the first amplifying circuit 24 or the redundancy circuit 30 has a zero level at any instant. Considering the feature, any coupling circuit, e.g., a hybrid coupler, may be used instead of the second switch 38 in an alternative of the present embodiment. In such an embodiment, the coupling circuit adds the output signals of the first amplifying circuit 24 and the redundancy circuit 30, and provides the added signal to the output impedance matching circuit 40. In this case, it is preferable that a delay-compensating circuit is included in at least one signal path so that the difference in delays in the signal paths is eliminated.

Figure 4:
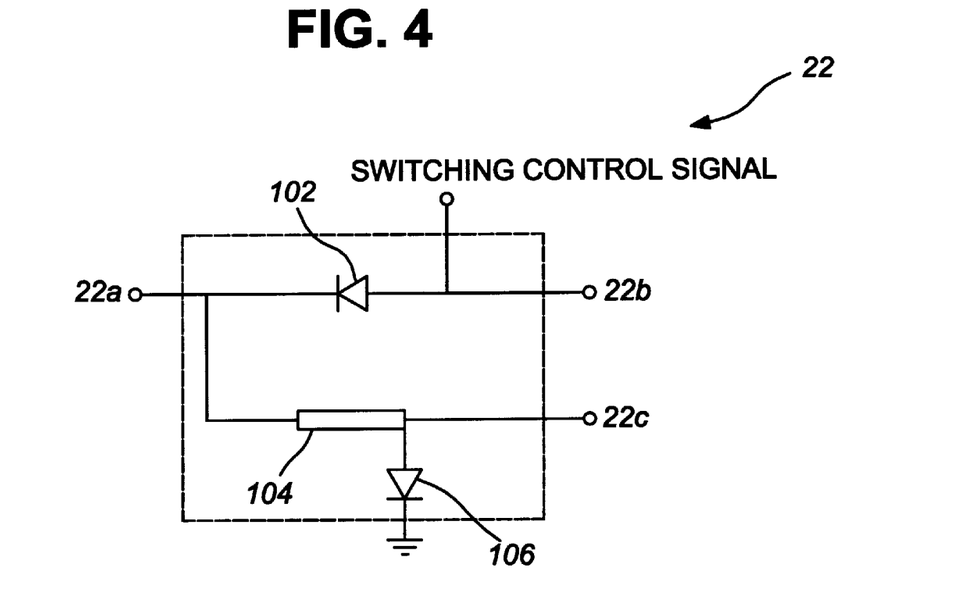
FIG. 4 is a detailed block diagram of an embodiment of the first switch shown in FIG. 3.

FIG. 4 illustrates an embodiment of the first switch 22 shown in FIG. 3 in detail. The first switch of FIG. 4 includes two pin diodes 102 and 106, and a guiding transmission line 104. The guiding transmission line 104 has a length of one quarter of the wavelength of the RF signal. An anode of the diode 102 is connected to the input node 22a, and a cathode thereof is connected to the first output node 22b. One end of the guiding transmission line 104 is connected to the anode of the diode 102, and the other end thereof is connected to the second output node 22c. The diode 106 is connected between ground and the other end of the guiding transmission line 104. Meanwhile, the switching control signal is provided through the first output node 22b in the present embodiment.

The first switch of FIG. 4 operates as follows. When the switching control signal is at HIGH level, the diodes 102 and 106 are forward-biased and thus turned on. At this time, most of the signal supplied through the input node 22a is transmitted to the first amplifying circuit through the diode 102. Even though a small portion of the supplied signal may be incident into the guiding transmission line 104, such a leakage flows into ground via the diode 106. Meanwhile, when the switching control signal is at LOW level, the diodes 102 and 106 are reverse-biased and thus turned off. At this time, the signal supplied through the input node 22a is transmitted to the redundancy circuit 30 through the guiding transmission line 104 and the second output node 22c.

Figure 5:
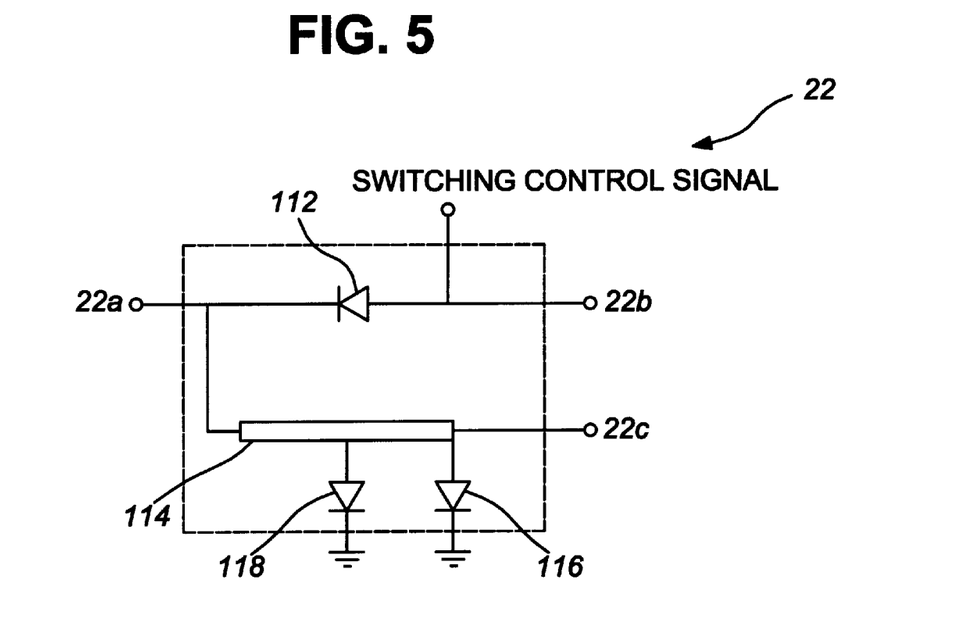
FIG. 5 is a detailed block diagram of another embodiment of the first switch shown in FIG. 3.

FIG. 5 illustrates another embodiment of the first switch 22 shown in FIG. 3 in detail. The first switch of FIG. 5 includes three pin diodes 112, 116, and 118, and a guiding transmission line 114. The guiding transmission line 114 has a length of a half of the wavelength of the RF signal. An anode of the diode 112 is connected to the input node 22a, and a cathode thereof is connected to the first output node 22b. One end of the guiding transmission line 114 is connected to the anode of the diode 112, and the other end thereof is connected to the second output node 22c. The diode 116 is connected between ground and the other end of the guiding transmission line 114. The diode 118 is connected between ground and a central position of the guiding transmission line 114. Meanwhile, the switching control signal is provided through the first output node 22b also in the present embodiment.

The first switch of FIG. 5 operates as follows. When the switching control signal is at HIGH level, all the diodes 112,116, and 118 are forward-biased and thus turned on. At this time, most of the signal supplied through the input node 22a is transmitted to the first amplifying circuit through the diode 112. Even though a small portion of the supplied signal may be incident into the guiding transmission line 114, such a leakage flows into ground via the diodes 116 and 118. Meanwhile, when the switching control signal is at LOW level, all the diodes 112, 116, and 118 are reverse-biased and thus turned off. At this time, the signal supplied through the input node 22a is transmitted to the redundancy circuit 30 through the guiding transmission line 114 and the second output node 22c.

Figure 6:
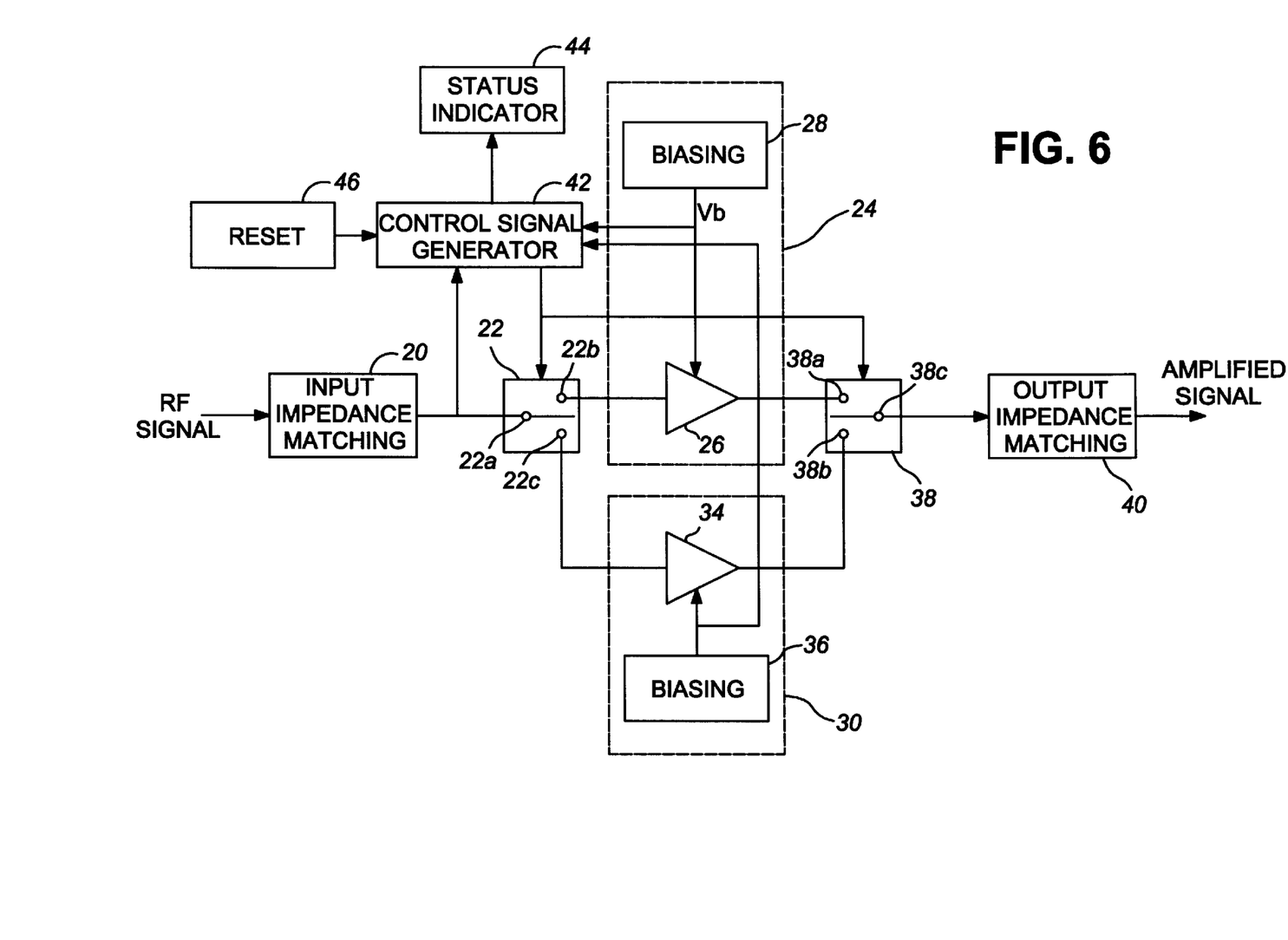
FIG. 6 is a block diagram of another embodiment of the low-noise amplifier according to the present invention.

FIG. 6 illustrates another embodiment of the low-noise amplifier according to the present invention. The low-noise amplifier of FIG. 6 has a similar configuration to that of FIG. 3 except the redundancy circuit 30. In FIG. 6, the redundancy circuit 30 includes an amplifying circuit having at least one amplifying stage 34 biased by a biasing circuit 36. Accordingly, the redundancy circuit 30 can amplify an input signal rather than simply bypassing the input signal. In case that one of two amplifying circuits is inoperable, the other one can perform the amplification of the input signal. Meanwhile, in an alternative of the present embodiment, the biasing circuit 36 in the redundancy circuit 30 may be omitted. In such an embodiment, the amplifying stage 34 may be biased by the biasing circuit 28 in the first amplifying circuit 24. Since the other features of the low-noise amplifier of FIG. 6 is the same as those of the amplifier of FIG. 3, the detailed description thereof is omitted.

Figure 7:
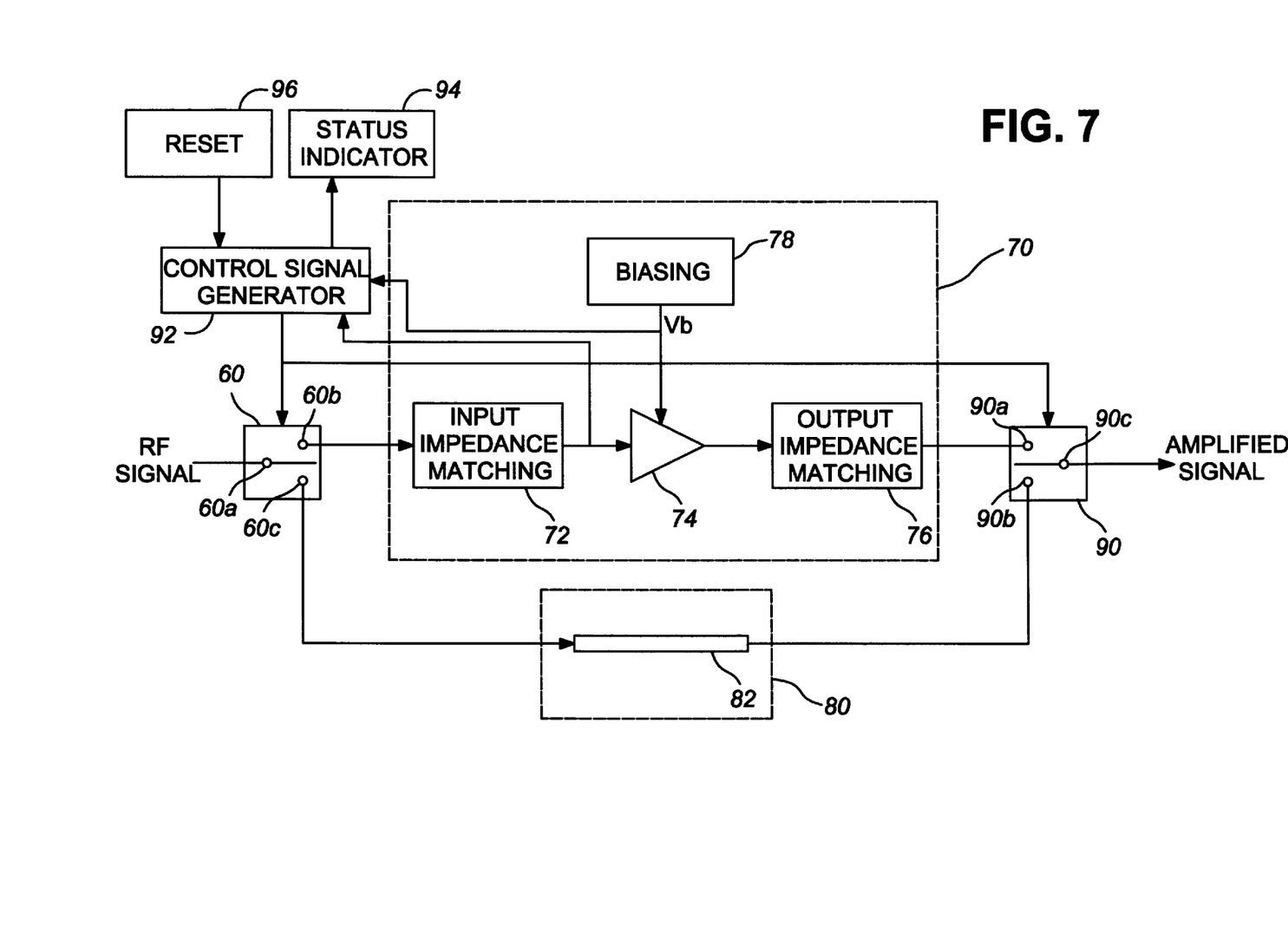
FIG. 7 is a block diagram of still another embodiment of the low-noise amplifier according to the present invention.

FIG. 7 illustrates still another embodiment of the low-noise amplifier according to the present invention. The low-noise amplifier of FIG. 7 includes a first switch 60, a first amplifying circuit 70, a redundancy circuit 80, a second switch 90, and a control signal generator 92.

The input node 60a of the first switch 60 is connected to an external RF signal source. Two output nodes 60b and 60c of the first switch 60 are connected to the input terminals of the first amplifying circuit 70 and the redundancy circuit 80, respectively. The input node 60a of the first switch 60 is electrically connected to either the first output node 60b or the second output node 60c in response to a switching control signal. Accordingly, the first switch 60 provides a signal from the RF signal source to either the first amplifying circuit 70 or the redundancy circuit 80 according to the switching control signal.

The first amplifying circuit 70 includes an input impedance matching circuit 72, an amplifying stage 74, and an output impedance matching circuit 76. The input impedance matching circuit 72 matches the impedance of the first amplifying circuit 70 to the impedance of a transmission line connecting the first switch 60 and the first amplifying circuit 70 at the input stage of the first amplifying circuit 70, so that the reflection of the input signal at the input stage is minimized. The amplifying stage 74 is biased by a biasing circuit 78 and amplifies the signal supplied through the input impedance matching circuit 70. The output impedance matching circuit 76 matches an impedance of the first amplifying circuit 70 to the impedance of a transmission line connecting the first amplifying circuit 70 and the second switch 90 at the output stage of the first amplifying circuit 70, so that the reflection of the amplified signal at the output stage is minimized.

Two input nodes 90a and 90b of the second switch 90 are connected to the output terminals of the first amplifying circuit 70 and the redundancy circuit 80, respectively. The output node 90c of the second switch 90 is connected to an external signal processing circuit. The output node 90c of the second switch 90 is electrically connected to the first input node 90a or the second input node 90b in response to the switching control signal. Accordingly, the second switch 90 selects either the output of the first amplifying circuit 70 or that of the redundancy circuit 80 according to the switching control signal, and outputs the selected signal to the signal processing circuit.

The control signal generator 92 monitors the operation status of the first amplifying circuit 70 and generates the switching control signal, of which level changes based on the monitored result. In the present embodiment, the control signal generator 92 monitors the normality of the biasing voltage Vb provided by the biasing circuit 78 to the amplifying stage 74 to change the level of the switching control signal. Alternatively, the control signal generator 92 may detect the current or voltage level of the input signal of the first amplifying circuit 70 in addition to the biasing voltage Vb to reflect the current or voltage level in determining the level of the switching control signal. In FIG. 7, the function and operation of a status indicator 94 and a reset circuit are the same as those in FIG. 3, and thus detailed description thereof is omitted.

Figure 8:
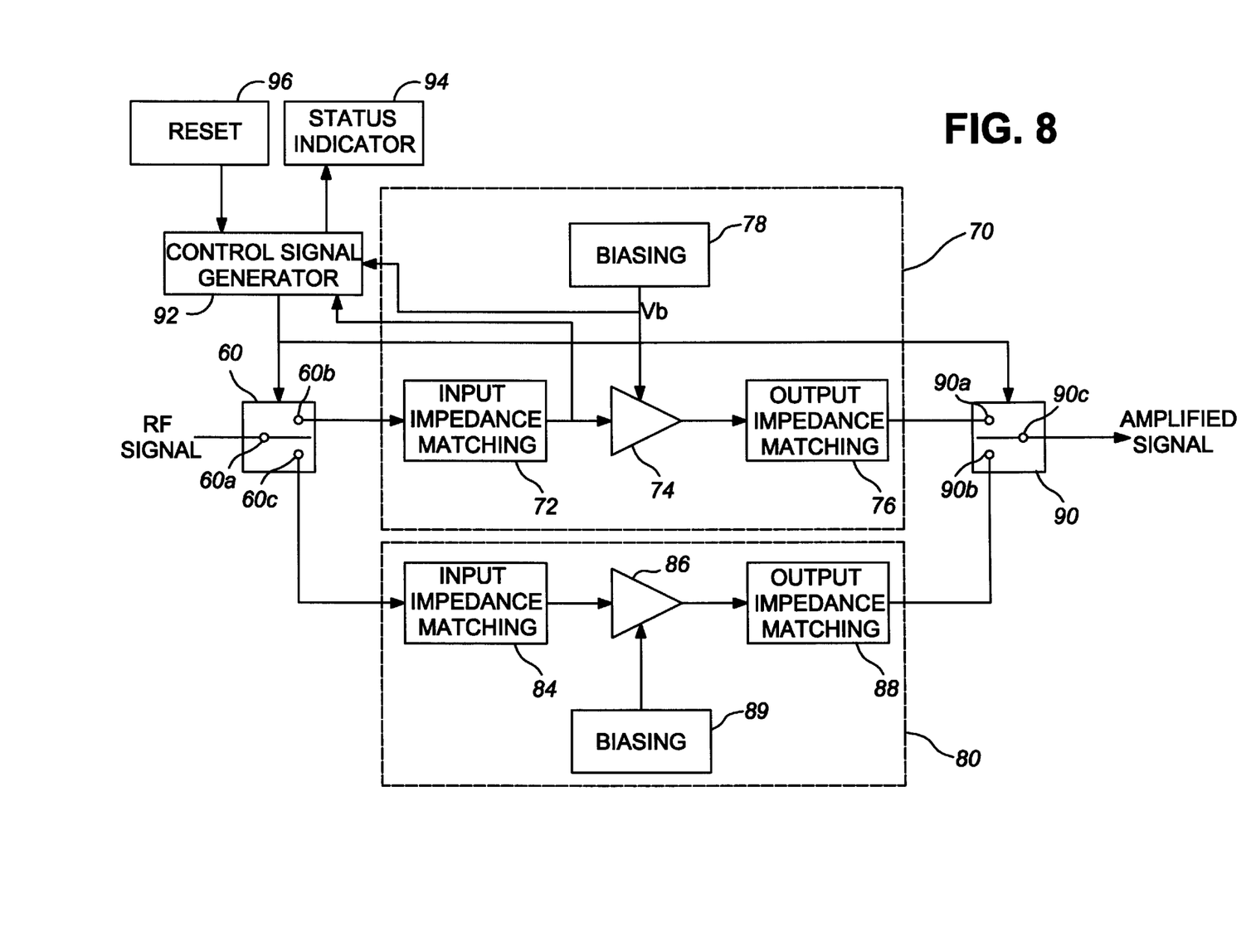
FIG. 8 is a block diagram of yet still another embodiment of the low-noise amplifier according to the present invention.

FIG. 8 illustrates yet still another embodiment of the low-noise amplifier according to the present invention. The low-noise amplifier of FIG. 8 has a similar configuration to that of FIG. 7 except the redundancy circuit 80. In FIG. 8, the redundancy circuit 80 includes an amplifying circuit having at least one amplifying stage 86 biased by a biasing circuit 89. Accordingly, the redundancy circuit 80 can amplify an input signal rather than simply bypassing the input signal. In case that one of two amplifying circuits is inoperable, the other one can perform the amplification of the input signal. Since the other features of the low-noise amplifier of FIG. 8 is the same as those of the amplifier of FIG. 7, the detailed description thereof is omitted.

Although the present invention has been described in detail above, it should be understood that the foregoing description is illustrative and not restrictive. Those of ordinary skill in the art will appreciate that many obvious modifications can be made to the invention without departing from its spirit or essential characteristics.

Accordingly, the scope of the invention should be interpreted in the light of the following appended claims.

What is claimed is:

1. A low-noise amplifier for receiving and amplifying a RF signal from a RF signal source to output an amplified signal, comprising:

an input impedance matching circuit disposed between the RF signal source and an input node of a first switch;

said first switch having the input node and a first and a second output node;

a first amplifying circuit biased by a predetermined biasing voltage and having an input terminal connected to the first output node of said first switch;

a redundancy circuit having an input terminal connected to the second output node of said first switch;

combining means equipped with a first input node connected to an output terminal of said first amplifying circuit and a second input node connected to an output terminal of said redundancy circuit for combining, signals received through the first and the second input nodes to output a combined signal through an output node;

an output impedance matching circuit connected to the output node of said combing means; and a control signal generator for monitoring a status of said first amplifying circuit and generating a switching control signal of which state changes according to a monitored result, wherein the input node of said first switch is electrically connected to the first output node when the first amplifying circuit operates normally and the switching control signal is at a first state, and is connected to the second output node when the first amplifying circuit operates abnormally and the switching control signal is at a second state.

2. The low-noise amplifier as claimed in claim 1, wherein said first switch comprises:

a first diode having a first terminal connected to the input node and a second terminal connected to the first output node;

a guiding transmission line having an end connected to the first terminal of said first diode and another end connected to the second output node; and a second diode having a first terminal connected to ground and a second terminal connected to the other end of said guiding transmission line, wherein the guiding transmission line has a length of one quarter of a wavelength of the RF signal.

3. The low-noise amplifier as claimed in claim 1, wherein said first switch comprises:

a first diode having a first terminal connected to the input node and a second terminal connected to the first output node;

a guiding transmission line having an end connected to the first terminal of said first diode and another end connected to the second output node;

a second diode having a first terminal connected to ground and a second terminal connected to the other end of said guiding transmission line; and a third diode having a first terminal connected to ground and a second terminal connected to a central position of said guiding transmission line, wherein the guiding transmission line has a length of a half of a wavelength of the RF signal.

4. The low-noise amplifier as claimed in claim 1, wherein said combining means consists of:

a second switch having a first and second input nodes and an output node, wherein the output node is electrically connected to the first input node when the switching control signal is in the first state, and is connected to the second input node when the switching control signal is in the second state.

5. The low-noise amplifier as claimed in claim 1, wherein said control signal generator detects a normality of the biasing voltage to output the switching control signal of the first state when the biasing voltage is normal and to output the switching control signal of the second state when the biasing voltage is abnormal.

6. The low-noise amplifier as claimed in claim 1, wherein said control signal generator detects a normality of the biasing voltage and a level of an input signal of the first amplifying circuit, to output the switching control signal of the first state when both the biasing voltage and the level are normal and to output the switching control signal of the second state when the biasing voltage or the level is abnormal.

7. A low-noise amplifier for receiving and amplifying a RF signal from a RF signal source to output an amplified signal, comprising:

a first switch equipped with an input node and a first and a second output nodes for receiving the RF signal through the input node and outputting the RF signal through either the first or the second output node;

a first amplifying circuit comprising an amplifying stage, an input impedance matching circuit disposed between the first output node of said first switch and an input terminal of said amplifying stage, and an output impedance matching circuit disposed between an output terminal of said amplifying stage and an input node of combining means;

a redundancy circuit having an input terminal connected to the second output node of said first switch;

said combining means equipped with the first input node connected to an output terminal of said first amplifying circuit and a second input node connected to an output terminal of said redundancy circuit for combining signals received through the first and the second input nodes to output a combined signal through an output node; and a control signal generator for monitoring a status of said first amplifying circuit and generating a switching control signal of which state changes according to a monitored result, wherein the input node of said first switch is electrically connected to the first output node when the first amplifying circuit operates normally and the switching control signal is at a first state, and is connected to the second output node when the first amplifying circuit operates abnormally and the switching control signal is at a second state.

8. The low-noise amplifier as claimed in claim 7, wherein said combining means consists of:

a second switch having a first and second input nodes and an output node, wherein the output node is electrically connected to the first input node when the switching control signal is in the first state, and is connected to the second input node when the switching control signal is in the second state.

* * * * *